United States Patent
Hayat-Dawoodi

(10) Patent No.: US 6,922,048 B2
(45) Date of Patent: Jul. 26, 2005

(54) INTEGRATED CIRCUIT LEADFRAMES PATTERNED FOR MEASURING THE ACCURATE AMPLITUDE OF CHANGING CURRENTS

(75) Inventor: Kambiz Hayat-Dawoodi, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/789,642

(22) Filed: Mar. 1, 2004

(65) Prior Publication Data

US 2004/0164722 A1 Aug. 26, 2004

Related U.S. Application Data

(62) Division of application No. 09/873,057, filed on Jun. 2, 2001, now Pat. No. 6,853,178.
(60) Provisional application No. 60/212,660, filed on Jun. 19, 2000.

(51) Int. Cl.$^7$ ............................................. G01R 33/02
(52) U.S. Cl. ................................. 324/117 H; 324/252
(58) Field of Search .................... 324/117 H, 207.2, 324/251, 252; 257/425, 427, E43.002; 338/32 R, 32 H

(56) References Cited

U.S. PATENT DOCUMENTS

| | | | |
|---|---|---|---|
| 4,797,726 A | 1/1989 | Manabe | 357/70 |
| 4,918,511 A | 4/1990 | Brown | 357/70 |
| 5,021,865 A | 6/1991 | Takahashi et al. | 357/70 |
| 5,175,610 A | 12/1992 | Kobayashi | 257/676 |
| 5,757,068 A | 5/1998 | Kata et al. | 257/668 |
| 5,963,028 A | * 10/1999 | Engel et al. | 324/207.2 |
| 6,759,841 B2 | * 7/2004 | Goto et al. | 324/117 H |

* cited by examiner

Primary Examiner—Vinh Nguyen
Assistant Examiner—Russell M. Kobert
(74) Attorney, Agent, or Firm—Wade James Brady, III; Frederick J. Telecky, Jr.

(57) ABSTRACT

A metallic leadframe for use with a semiconductor chip intended for operation in a changing magnetic field comprises a chip mount pad having at least one slit penetrating the whole thickness of the pad and substantially traversing the area of the pad from one edge to the opposite edge. This slit is wide enough to interrupt electron flow in the pad plane, but not wide enough to significantly reduce thermal conduction in a direction normal to the pad plane, whereby the slit is operable to disrupt eddy currents induced in the pad by the changing magnetic field.

A semiconductor device intended for operation in a changing magnetic field, comprising a leadframe with a chip mount pad having at least one slit in a configuration operable to suppress eddy currents induced in the pad by the changing magnetic field; an integrated circuit chip, having an active and a passive surface; the passive surface attached to the mount pad by a polymeric material; and the active surface having a Hall structure including current and voltage terminals integrated into the circuit, whereby the changing magnetic field can be measured without diminution by said eddy currents.

8 Claims, 3 Drawing Sheets

INTEGRATED CIRCUIT LEADFRAMES PATTERNED FOR MEASURING THE ACCURATE AMPLITUDE OF CHANGING CURRENTS

CROSS-REFERENCE TO RELATED APPLICATIONS

This application is a divisional of U.S. patent application Ser. No. 09/873,057, filed Jun. 2, 2001, now U.S. Pat. No. 6,853,178 which claims benefit of Ser. No. 60/212,660 filed Jun. 19, 2000.

FIELD OF THE INVENTION

The present invention is related in general to the field of semiconductor devices and methods and more specifically to structure and fabrication of leadframes for integrated circuits and their application for accurate current measurements.

DESCRIPTION OF THE RELATED ART

The principle of the Hall effect is shown in FIG. 1. A current I of electrons (having elementary charge e and density n) flows in longitudinal y-direction through a strip-like electrical conductor 101 of thickness d, which is thin compared to width 102. Perpendicular to the plane of the conductor is a magnetic field of strength H (z-direction). This field diverts the moving electrons due to their high mobility in the x-direction (Hall effect), creating an electric field balancing the magnetic force. In the x-direction, an electric potential difference or voltage V is now established (Hall voltage):

$$V = \text{const} \cdot I \cdot H / d. \quad (1)$$

The const is the Hall coefficient:

$$\text{const} = r/n \cdot e, \quad (2)$$

where r is a factor depending on the mobility of the electrons. As FIG. 1 shows, two terminals 103 and 104 serve as current input and output, and two terminals 105 and 106 as voltage read-points. For precise positioning of these terminals see U.S. Pat. No. 5,646,527, issued on Jul. 8, 1997 (Mani et al., "Hall-Effect Device with Current and Hall-Voltage Connections").

By measuring the Hall voltage V, the Hall effect can be used to measure the magnetic field H. This has been accomplished especially when the conductor 101 is manufactured in combination with integrated circuits in semiconductor materials such as silicon, silicon germanium, or gallium arsenide using modern wafer fabrication technology. Examples of a variety of integrated arrangements can be found, for instance, in U.S. Pat. No. 3,852,802, issued on Dec. 3, 1974 (Wolf et al., "Integrated Circuit Hall Effect Device and Method"); U.S. Pat. No. 5,572,058, issued on Nov. 5, 1996 (Biard, "Hall Effect Device formed in an Epitaxial Layer of Silicon for Sensing Magnetic Fields Parallel to the Epitaxial Layer").

When the magnetic field H is generated by an original current i through a wire or another conductor, which is located in proximity to the Hall structure so that the magnetic field is normal to the plane of the Hall structure, then the measurement of the magnetic field H, in turn, can be used to determine the strength of the original current. An example is described in U.S. Pat. No. 5,017,804, issued on May 21, 1991 (Harnden et al., "Hall Sensing of Bond Wire Current"). For this measurement technique, it is advantageous to employ a null-measurement technique as described in U.S. Pat. No. 4,823,075, issued on Apr. 18, 1989 (Alley, "Current Sensor using Hall Effect Device with Feedback").

The wire or conductor for the electrical current can be integrated into a semiconductor integrated circuit, which also includes an integrated Hall structure. An example of such integrated current conductor together with an integrated Hall structure has been published by R. Steiner et al.: "Fully Packaged CMOS Current Monitor Using Lead-on-Chip Technology", Proc. Eleventh Ann. Internat. Workshop on MEMS (Micro-Electro-Mechanical Systems), 1998, pp. 603–608. Unfortunately, such integrated circuit systems fail to measure correct current values whenever the current i changes rapidly with time t. The rapidly changing magnetic fields dH/dt associated with high di/dt values induce strong eddy currents in any metal used to give mechanical and electrical support in the assembly of the semiconductor chip. These eddy currents, in turn, generate magnetic flux opposed to the original changing magnetic flux, diminishing the measured H values and thus the calculated i values.

As a consequence, in applications in which it is important to follow high di/dt pulses as precisely as possible, the measurement of these rapidly changing currents results in erroneous amplitudes and is furthermore coupled with delays and losses.

An urgent need has therefore arisen to conceive a concept for a reliable, high-performance, yet low-cost structure and method of measuring the true value of rapidly changing electrical currents. Preferably, this method should be based on fundamental design concepts flexible enough to be applied for different semiconductor product families and a wide spectrum of process and assembly variations. No extra process steps should be required. The method should not only meet high electrical and information performance requirements, but should also achieve improvements towards the goals of enhanced process yields and device reliability. Preferably, these innovations should be accomplished using the installed equipment base so that no investment in new manufacturing machines is needed.

SUMMARY OF THE INVENTION

In the first embodiment of the present invention, a metallic leadframe for use with a semiconductor chip intended for operation in a changing magnetic field comprises a chip mount pad having at least one slit penetrating the whole thickness of the pad and substantially traversing the area of the pad from one edge to the opposite edge. This slit is wide enough to interrupt electron flow in the pad plane, but not wide enough to significantly reduce thermal conduction in a direction normal to the pad plane, whereby the slit is operable to disrupt eddy currents induced in the pad by the changing magnetic field.

In the second embodiment of the invention, the chip mount pad of the invention has a plurality of slits in a configuration operable to suppress eddy currents induced in the pad by a changing magnetic field.

The present invention is related to integrated circuits (ICs) of any kind, especially those used in conjunction with open and closed loop current transducers and current/power measurement applications based on the use of Hall structures for magnetic field measurements. Due to the trend in semiconductor technology to integrate more and more functions on one chip, these ICs can be found in many semiconductor device families such as processors, digital, analog and logic devices, and high frequency and high power devices.

In the third embodiment, a semiconductor device intended for operation in a changing magnetic field, comprises a leadframe featuring a chip mount pad with at least one slit in a configuration operable to suppress eddy currents induced in the pad by the changing magnetic field. The device has an integrated circuit chip with an integrated Hall structure, the chip being attached to the mount pad. When the device is positioned in a changing magnetic field, with the Hall structure normal to the field, the field strength can be measured without diminution by eddy currents.

In the fourth embodiment, the device further has an integrated current conductor in the proximity of the Hall structure, designed so that it can conduct a changing electric current, which in turn creates the changing magnetic field normal to the plane of the Hall structure.

The package type of the IC can be a plastic dual in-line package (PDIP), small outline IC (SOIC), quad flat pack (QFP), thin QFP (TQFP), SSOP, TSSOP, TVSOP, or any other leadframe-based package.

It is an aspect of the present invention to provide a leadframe design using at least one slit having a width from about 0.01 to 0.5 mm, stamped into the chip pad. The leadframe material can be copper, copper alloy, brass, aluminum, iron-nickel alloy, invar or any other material customarily used in semiconductor device production.

Another aspect of the invention is to reach the embodiments without the cost of equipment changes and new capital investment, by using the installed fabrication equipment.

Another aspect of the present invention is to provide the concepts of eddy current suppression and heat dissipation with enough flexibility so that a single leadframe design can be found applicable for a whole family of IC chips of various chip areas.

These aspects have been achieved by the embodiments cited above. The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENT

Figure 1:
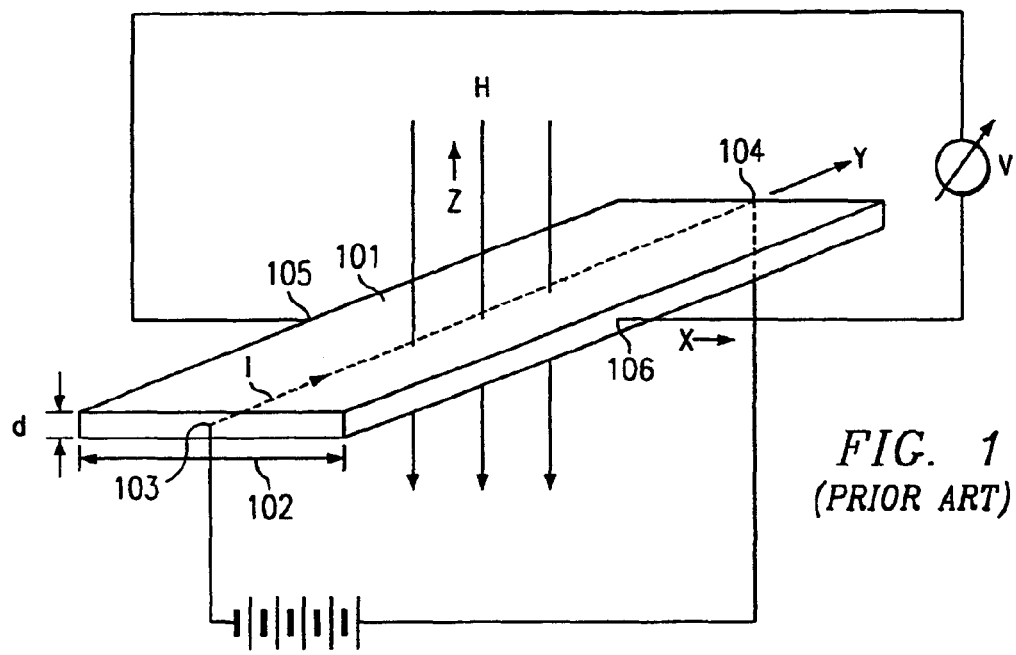
FIG. 1 depicts a simplified Hall structure and the measurement of the Hall voltage as performed in the technology of the prior art.
Figure 2:
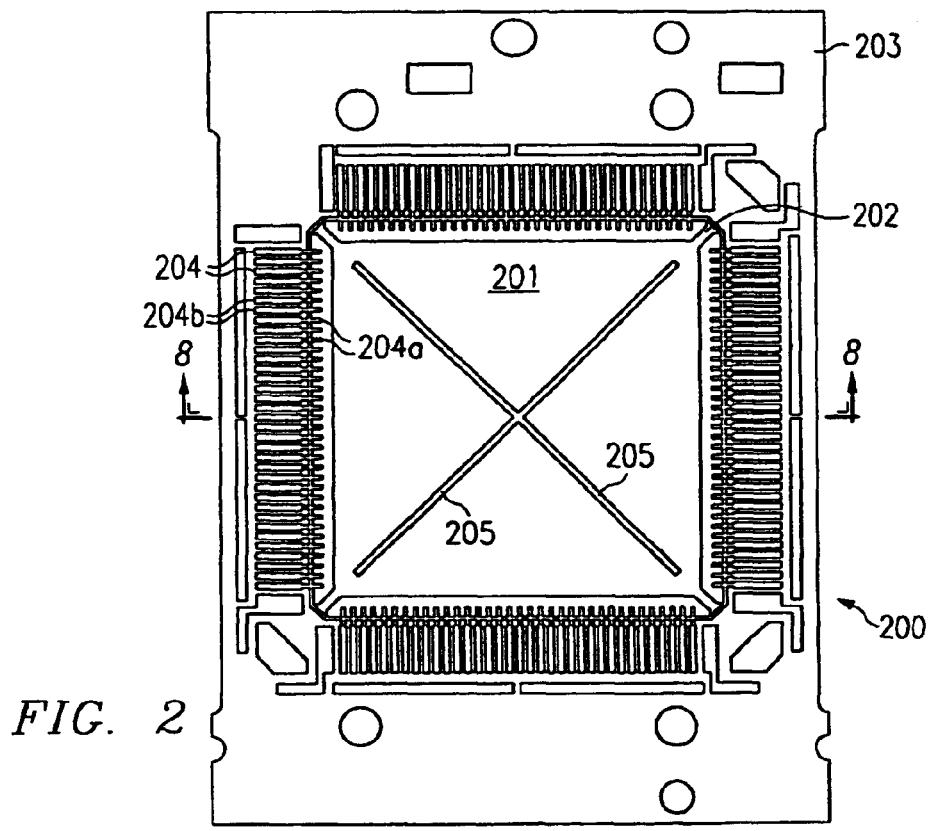
FIG. 2 is a simplified top view of an individual IC leadframe illustrating an example of the slits in the chip mount pad.

The invention relates to a single piece metallic leadframe that can be used in current semiconductor device production processes and installed equipment base. FIG. 2 depicts a single, rectangular-shaped leadframe unit, generally designated 200, for a typical semiconductor Quad Flat Pak (QFP) device. Specifically, the leadframe for a 144-lead plastic thin QFP is shown; dimensions of the finished device after molding are 20×20×1.4 mm. In many applications of the Hall structure and magnetic field measurements, the integrated circuit (IC) chip and thus the requirement for leadframe and package will be much smaller, however FIG. 2 has been selected for clarity and illustration purposes.

In the center of the leadframe is the chip mount pad 201. As shown in FIG. 2, the area of mount pad 201 is slightly larger than the area of the IC chip to be mounted (see also FIG. 8). In other modifications of the invention, the pad area may be smaller than the chip area as long as the requirements for thermal heat dissipation can be fulfilled. In the device assembly process, the mount pad receives the chip attach polymer, thus enabling the chip mount process (discussed in FIG. 8).

Further, the leadframe unit 200 includes a plurality of support members 202, which extend from the leadframe rails 203 to the chip mount pad 201. In the example of FIG. 2, the QFP device requires 4 support members connecting the mount pad 201 to the four corners of the rectangular leadframe. The QFP design further includes a plurality of leadframe segments 204 having their first end 204a near mount pad 201 and their second end 204b remote from mount pad 201.

It is pivotally important for the present invention that the, chip mount pad has at least one slit through the thickness of the mount pad material. In FIG. 2, a plurality of slits 205 is shown in mount pad 201. These slits 205 penetrate the whole thickness of the mount pad (see also FIG. 8) and substantially traverse the area of mount pad 201 from one edge or corner of the pad to the opposite edge or corner. For proper design of the slits according to the invention it is required that the slits are wide enough to interrupt electron flow in the pad plane, when eddy currents are induced by changing magnetic fields, yet not wide enough to significantly reduce thermal conduction in a direction normal to the pad plane.

In the manufacture of leadframes, the slits are stamped into the leadframe material. In this case, the practical range of slit widths extends from about 0.01 to 0.5 mm. When leadframes are etched, narrower slit widths are manufacturable.

Suitable sheet-like starting materials of the leadframe typically have a thickness in the range from about 100 to 300µm. Suitable materials include copper, copper alloy, brass, aluminum, iron-nickel alloy and invar. Portions of the leadframe may also be plated, selectively or by flood plating techniques, with highly conductive metals, such as silver, copper, gold, nickel, or palladium. Chip mount pad and support members (and other features) of the leadframe may be stamped or etched from the sheet-like starting material. Remote segments ends may be plated with solderable metal alloys such as tin/lead, tin/indium, tin/silver, tin/bismuth, or conductive adhesive compounds.

In many applications of the invention, a current conductor is integrated in the IC, which carries the original changing current (and causes the changing magnetic field with its effect of the induced eddy currents in the chip mount pad). This current may have considerable strength. Consequently, substantial thermal energy is generated and has to be dissipated to the outside world (heat sink). It is, therefore, essential that the metallic area of the mount pad available for thermal dissipation is not unduly diminished by removing some leadframe material for opening the slits. As a consequence, the present invention avoids any wide openings in the mount pad, or pad shrinkages, such as employed for maximizing mold compound adhesion to the passive surface of the chip. Examples of adhesion-maximizing leadframes are described in U.S. pat. applications Ser. No. 60/141,912, filed on 30 Jun. 1999 (Arguelles, "Deformation-Absorbing Leadframe for Semiconductor Devices"), and Ser. No. 09/574,330, filed on 19 May 2000 (Palasi, "Leadframe for Balanced Adhesion and Heat Dissipation in Semiconductor Devices").

Figure 8:
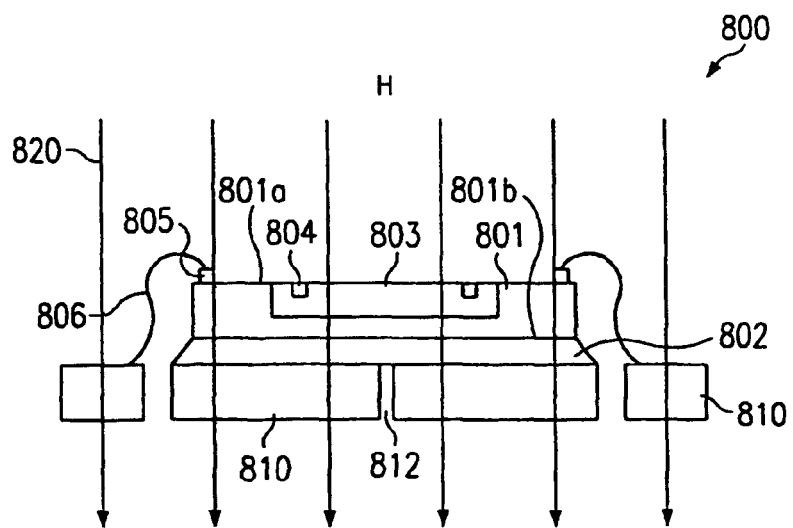
FIG. 8 is a schematic cross section through the leadframe and the partially assembled chip shown in FIG. 7 according to the third embodiment of the invention.

Cut 8—8 in FIG. 2 refers to the cross section shown in FIG. 8.

Figure 3:
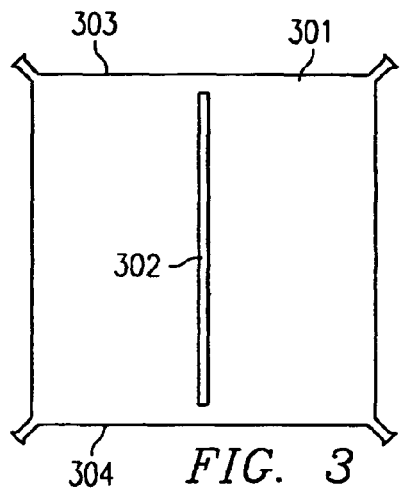
FIG. 3 is a schematic top view of a leadframe chip mount pad illustrating an example of the first embodiment of the invention.
Figure 4:
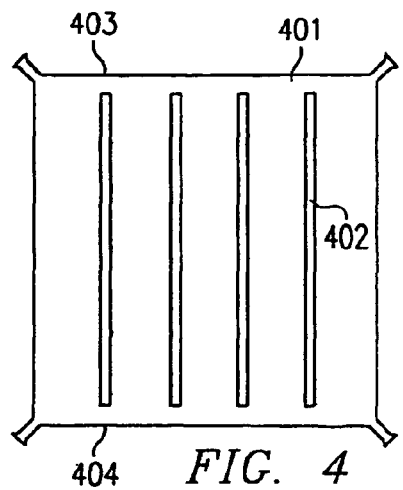
FIG. 4 is a schematic top view of a leadframe chip mount pad illustrating an example of the second embodiment of the invention.
Figure 5:
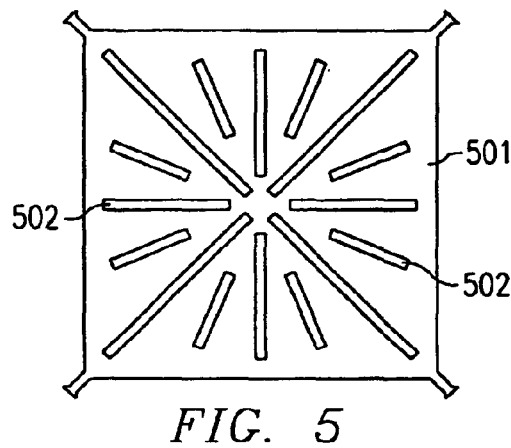
FIG. 5 is a schematic top view of a leadframe chip mount pad illustrating another example of the second embodiment of the invention.

Other variations of slit configurations are shown in FIGS. 3 to 5. FIG. 3 illustrates the top view of an example of the first embodiment of the invention. A leadframe chip mount pad 301, which is intended to be operated in a changing magnetic field, has one slit 302 penetrating the whole thickness of the pad metal and substantially traversing the area of the pad from one edge 303 to the opposite edge 304. The width of the slit is in the range from about 0.01 to 0.5 mm, significantly reducing any eddy current induced by the changing magnetic field and flowing in the plane of the pad 301. On the other hand, slit 302 is narrow enough to not interfere with the heat-dissipating capability and thermal conduction in a direction normal to the plane of the pad.

FIG. 4 illustrates the top view of an example of the second embodiment of the invention. A leadframe chip mount pad 401, which is intended to be operated in a changing magnetic field, has a plurality of slits 402 arranged in about parallel pattern and penetrating the whole thickness of the pad metal and substantially traversing the area of the pad from one edge 403 to the opposite edge 404. While the widths of the slits 402 do not have to be uniform, they are prefereably on the range from about 0.01 to 0.5 mm. Any eddy current induced by the changing magnetic field and flowing in the plane of pad 401 is strongly suppressed while the narrow widths of the slits do not significantly reduce thermal conduction in a direction normal to the plane of pad 401.

FIG. 5 shows another example of the second embodiment of the invention, a plurality of slits 502 in a leadframe pad 501, arranged in an approximately star-burst-like pattern. As in the previous FIGS. 3 and 4, the slits are about 0.01 to 0.5 mm wide and penetrate the whole thickness of the pad metal. The effects of the slit pattern in FIG. 5 relative to eddy current suppression and thermal performance preservation are similar to the slit pattern in FIG. 4.

Figure 6:
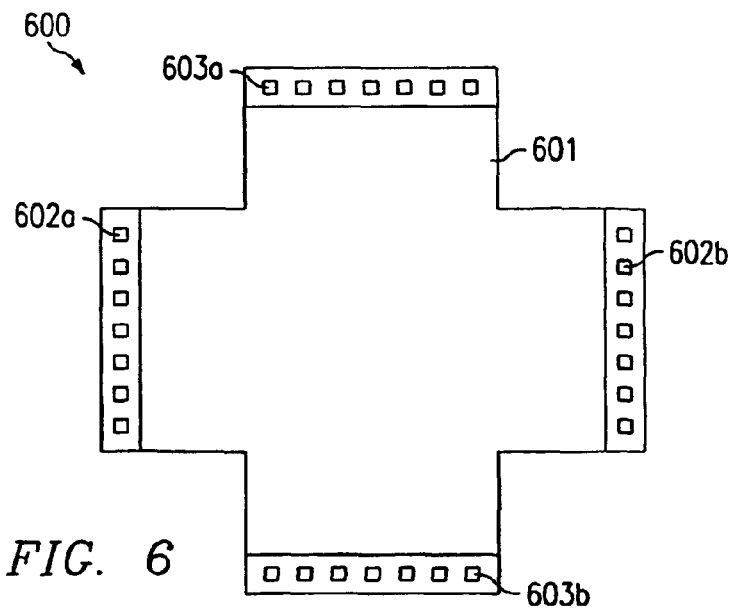
FIG. 6 is a schematic and enlarged top view of an integrated Hall structure.

FIG. 6 depicts an example of a Hall structure, generally designated 600, designed for integration into the IC of a semiconductor device. Heavily doped contact areas 602a, 602b, 603a and 603b are embedded in a shallow diffused n-well 601 (of thickness d in Eq. (1)). Contacts 602a and 602b serve as inputs/ outputs for the electric current I in Eq. (1). The Hall voltage V in Eq. (1) is measured between contacts 603a and 603b. The linear dimensions and the relative size of the Hall structure 600 can vary widely from miniature to large, dependent on the extent of the changing magnetic field to be measured in order to determine the field portion perpendicular to the structure.

Figure 7:
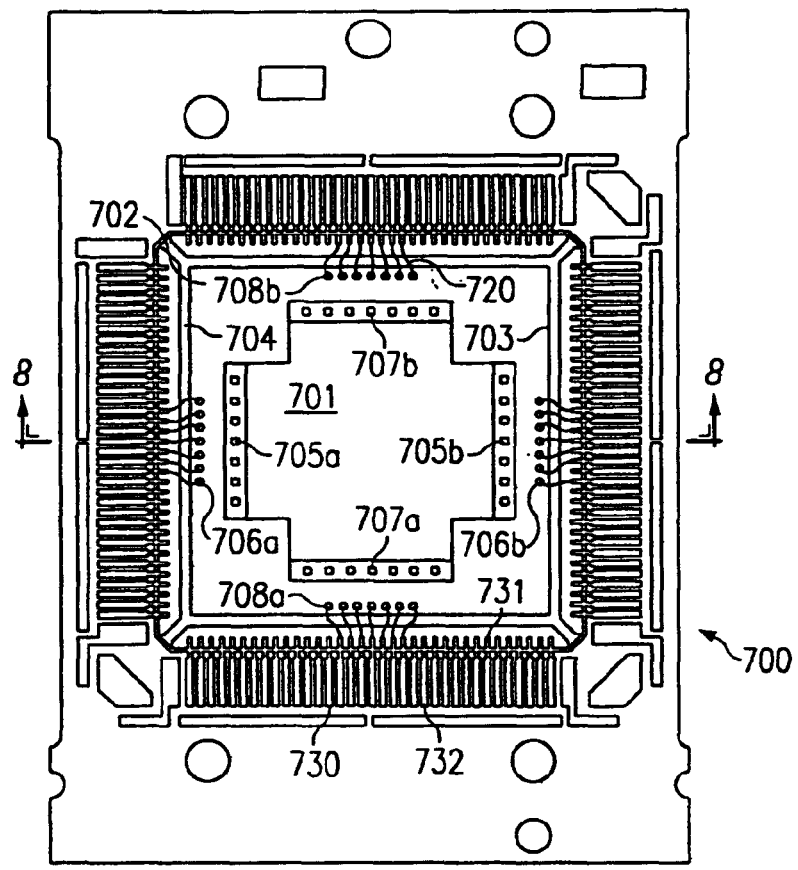
FIG. 7 is a simplified top view of an individual IC leadframe having a partially assembled chip with an integrated Hall structure.

By way of example, FIG. 7 shows a Hall structure 701 embedded in an IC 702 (not indicated in detail) fabricated in chip 703. Chip 703 is attached to leadframe chip pad 704, which has the same dimensions as described in FIG. 2. FIG. 7 illustrates an example of a semiconductor device, generally designated 700, intended for operation in a changing magnetic field and assembled on a leadframe analogous to the leadframe in FIG. 2, yet with a chip pad 703 having any of the slit configurations described in FIGS. 2, 3, 4, or 5. The slits operate to suppress eddy currents induced in chip pad 704 by the changing magnetic field.

In the example of FIG. 7, the current terminals 705a and 705b of the Hall structure 701 are connected by integrated conducting lines (not shown in FIG. 7) to metallized contact terminals 706a and 706b, respectively, at the chip periphery. From these contact terminals, standard bonding wires 720 (made of gold, copper, aluminum, or alloys thereof) form the connection of the chip to the leadframe segments 730 of the leadframe. Specifically, each bonding wire 720 is stiched to the respective first end 731 near mount pad 704, while the second end 732 remote from mount pad 704 is reserved for solder connection of each lead segment to other parts (in the "outside world").

In similar fashion, the voltage terminals 707a and 707b of the Hall structure 701 are connected by integrated conducting lines (not shown in FIG. 7) to metallized contact terminals 708a and 708b, respectively, at the chip periphery. From these contact terminals, standard bonding wires 720 form the connection to the leadframe segments 730 of the leadframe.

The incorporation of the Hall structure into an IC, as shown in FIG. 7, as well as the chip assembly and the construction of the package used for the IC, can be modified in numerous ways. For instance, instead of a plurality of current contacts, there may only be few or a single contact. Similar modifications can be made for the voltage contacts. Furthermore, the chip, bonding wires and near ends of lead segments may be encapsulated, preferably using transfer molding technology with polymeric (epoxy-based) compounds suitable for adhesion of the compound to the IC chip and the leadframe.

FIG. 8 depicts a cross section through the assembled device of FIG. 7 along cut lines 8—8, in combination with the cut of FIG. 2 along cut line 8—8. The assembled device, generally designated 800, shows chip 801 with its active surface 801a and its passive surface 801b. The passive surface 801b is attached to leadframe mount pad 810 by a polymeric material (typically epoxy- or polyimide-based). The active surface 801a has the n-well 803 of the Hall structure and the heavily n-doped regions 804 for the current and voltage terminals of the Hall structure. The IC of the chip (nor shown in FIG. 8) has bonding pads 805, from which bonding wires 806 connect to the leadframe segments 811.

The whole thickness of the chip pad 810 is traversed by slit 812 (the intersection of the two slits in FIG. 2). Not shown in FIG. 8 is the (optional) plastic package encapsulating devie 800.

FIG. 8 also indicates the changing magnetic field of strength H sympolized by the field lines 820. The assembled (and packaged) device 800 is positioned in the changing magnetic field H such that the changing magnetic field is normal to the plane of the Hall structure 803. The magnetic field can be measured accurately by the Hall structure, since, thanks to slits 812, no eddy currents in chip pad 810 can develop; therefore, there are no associated magnetic fields which could diminish the amplitude of the changing magnetic field H. The magnatic field, in turn, is created by a changing electric current i (not shown in FIG. 8). The amplitude of that current i can now be determined accurately from the measured magnetic field. The method is particularly preferred when i is rapidly changing (high di/dt) or is pulsed, but the method is also favorable for alternating currents i.

The method of measuring the accurate amplitude of a changing electric current i comprises the steps of:

provided an integrated circuit chip having an active and a passive surface, the active surface having an integrated circuit and an integrated Hall structure;

providing a metallic leadframe having a chip mount pad reducing or eliminating eddy currents in the vicinity of the Hall structure;

assembling the chip and the leadframe, and packaging the assembly;

positioning the packaged assembly in the changing magnetic field created by the changing electric current i such that the changing magnetic field is normal to the plane of the Hall structure;

measuring the changing voltage induced in the Hall structure by the changing magnetic field;

calculating the strength of the changing magnetic field, undiminished by the eliminated eddy currents, thereby determining the accurate amplitude of the changing electric current i causing the changing magnetic field.

It is advantageous for many applications to integrate the conductor for the rapidly changing current i into the IC of the semiconductor chip assembled on the metallic support designed with the slits of the present invention. In this case, the conductor and the Hall structure have to be in proximity such that the magnetic field of the changing current i is perpendicular to the plane of the Hall structure. The suppression of eddy currents in the metallic support allows the accurate determination of the changing magnetic field by the Hall technique and thus the calculation of the accurate amplitude of the changing electric current i.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, the structure of the chip mount pad of the leadframe can be modified to be suitable for chip families of elongated contours, or rectangular, or square perimeter. As another example, any magnetic sensing element can be used instead of a Hall structure, for instance a magneto-transistor or a giant magneto-resistor. It is therefore intended that the appended claims encompass any such modifications or embodiments.

I claim:

1. A semiconductor device intended for operation in a changing magnetic field, comprising:

a leadframe comprising a chip mount pad having at least one slit in a configuration operable to suppress eddy currents induced in said pad by said changing magnetic field;

an integrated circuit chip, having an active and a passive surface; said passive surface attached to said mount pad by a polymeric material; and said active surface having a Hall structure including current and voltage terminals integrated into said circuit, whereby said changing magnetic field can be measured without diminution by said eddy currents.

2. The device according to claim 1 further having an integrated current conductor in the proximity of said Hall structure, said conductor operable to conduct a changing electric current, creating said changing magnetic field normal to the plane of said Hall structure.

3. The device according to claim 1 further comprising leadframe segments having their first end near said mount pad and their second end remote from said mount pad.

4. The device according to claim 3 further comprising bonding wires interconnecting said Hall current and voltage terminals and respective first ends of said lead segments.

5. The device according to claim 4 further comprising encapsulation material surrounding said chip, said bonding wires and said first ends of said lead segments, while leaving said second ends of said lead segments exposed, whereby said second ends are suitable for solder interconnection to other parts.

6. The device according to claim 5 wherein said encapsulation material is a polymeric material selected from a group consisting of epoxy-based molding compounds suitable for adhesion to said active chip surface and said leadframe.

7. The device according to claim 5 wherein said solder attachment comprises solder materials selected from a group consisting of tin/lead, tin/indium, tin/silver, tin/bismuth, and conductive adhesive compounds.

8. The device according to claim 4 wherein said bonding wires are selected from a group consisting of gold, copper, aluminum, and alloys thereof.

* * * * *